METHOD OF DETERMINING THE INTENSITY OF A NUCLEAR-RADIATION BURST

Filed Sept. 19, 1966

INVENTORS
GARY L. GRUNDY
ROBERT J. HERICKHOFF
BY Thomas J. Nikolai
ATTORNEY

United States Patent Office 3,479,509
Patented Nov. 18, 1969

3,479,509

METHOD OF DETERMINING THE INTENSITY OF A NUCLEAR-RADIATION BURST

Gary L. Grundy, St. Paul, and Robert J. Herickhoff, Minneapolis, Minn., assignors to Sperry Rand Corporation, New York, N.Y., a corporation of Delaware Filed Sept. 19, 1966, Ser. No. 586,587
Int. Cl. H01j *39/00;* G01t *1/16*
U.S. Cl. 250—83.3 4 Claims

ABSTRACT OF THE DISCLOSURE

A method of determining the intensity, or dose rate in roentgens per second, of a radiation burst pulse by measuring the time delay between the radiation burst pulse and an output pulse that is generated by a pulse generating circuit by ionization currents which are induced in a semiconductor device by the radiation burst pulse.

A blocking oscillator is a transformer-coupled oscillator having a broad-band feedback path and is capable of generating large amplitude pulses having widths of approximately 0.05 to 25.0 microseconds. Such an oscillator possesses the desirable characteristic of having the active element nonconducting except during the period of pulse generation thus allowing high peak power output at a low value of average power. Further, it can be either monostable, in which a triggering signal is required to initiate the pulse generation, or astable, in which the circuit is free running and produces pulses at a fixed repetition frequency. One difficulty encountered in the design of a blocking oscillator is that the path of operation of the active element is very difficult to describe accurately because of the effects of circuit capacitances, transformer leakage inductance and a lack of active element characteristics covering the operation of the active element at control electrode high voltages and currents. As a result, the design of a blocking oscillator having certain prescribed characteristics is normally based upon empirical data, the exact pulse widths, rise times, and amplitudes are determined experimentally. A good discussion of the theory of operation of a blocking oscillator circuit may be found in "Pulse and Digital Circuits," Millman and Taub, McGraw-Hill, pages 272–284.

In recent years a considerable amount of time and effort has been expended upon the investigation of the effects of nuclear weapon bursts and simulated bursts of radiation on electronic components and semiconductor devices. Such work is expressly concerned with the effects due to X-ray, gamma ray, and neutron bombardment of a transient radiation environment. Two reports, REIC Report No. 19, June 1, 1961, and REIC Report No. 26, Apr. 19, 1963, "Radiation Effects Information Center," Battelle Memorial Institute, Columbus 1, Ohio, cover this phase of the effects of radiation with a listing of probable component degradations. As pointed out in the above referenced reports, transient radiation effects on electronic components such as semiconductor devices range from moderate to destructive with magnetic devices being the least susceptible to degraded performances. Prolonged radiation such as in the immediate proximity of an active reactor affects magnetic properties such as does prolonged heat. Those materials that owe their distinctive properties to special heat treatments are most rapidly and permanently affected by high energy radiation. Material such as ferrites that have low curie temperatures are impaired magnetically as their temperatures rise excessively either due to promixity to a heat source or to internal conversion of radiant energy into heat. Otherwise, ferrites are notably immune to radiation damage, to either temporary or long time exposure.

The effects of pulsed nuclear radiation on electronic components and materials have recently received increased attention by electronic engineers. This is so for a number of radiation hazards that concern the electronic engineer have required extensive experimentation and study to determine the best methods or guide lines for the design of radiation-hardened semiconductor devices. Published design reports on such effects indicate that although semiconductor elements may be temporarily adversely affected by low-intensity pulsed, radiation-fields such effects may not be long lasting and, in fact, may be of relatively short duration. The primary effect to semiconductor elements of low-intensity pulsed radiation fields is the generation of radiation induced ions within the semiconductor material. These radiation induced ions produce an ionizing current within the semiconductor material that in a juncture transistor behaves as a forward base current drive signal producing a transient forward bias of the base-emitter junction. This transient forward bias produces an erroneous signal in the effected transistor's output circuit; in a high-intensity neutron flux the effected semiconductor device may be destroyed. However, within certain limits a semiconductor element may be prevented from producing an erroneous output signal while still performing its desired function when submitted to a low- to intermediate-intensity pulsed radiation fields, i.e., radiation fields of not sufficient intensity to saturate the affected semiconductor element.

The dosimeter of the present invention is directed toward a semiconductor circuit that utilizes the radiation induced ions within a semiconductor element to effect a flux change in an associated saturable core which core is also utilized as the feedback transformer core of an associated monostable blocking oscillator. The core's flux change, which is proportional to the environmental radiation intensity, triggers the blocking oscillator causing it to emit an output pulse. The time delay between the radiation burst pulse and the output pulse is, accordingly, a function of the environmental radiation intensity. Additionally, by utilizing different numbers of turns on the winding coupling the radiation induced currents to the core the dosimeter is capable of metering different ranges of radiation intensity.

Accordingly, it is a primary object of the present invention to provide a dosimeter and a method of operation thereof for measuring the intensity of a nuclear radiation pulse.

It is a further object of the present invention to provide a semiconductor circuit that utilizes the radiation induced ions within a semiconductor element to effect a flux change in an associated saturable core which core is also utilized as a feedback transformer of an associated monostable blocking oscillator whereby the core's flux change, which is proportional to the environmental radiation intensity, triggers the blocking oscillator causing it to emit an output pulse the time delay between the radiation pulse and the output pulse being a function of the environmental radiation intensity.

These and other more detailed and specific objectives will be disclosed in the course of the following specification, reference being had to the accompanying drawings in which.

Figures 1, 2, 3, 4, 5:
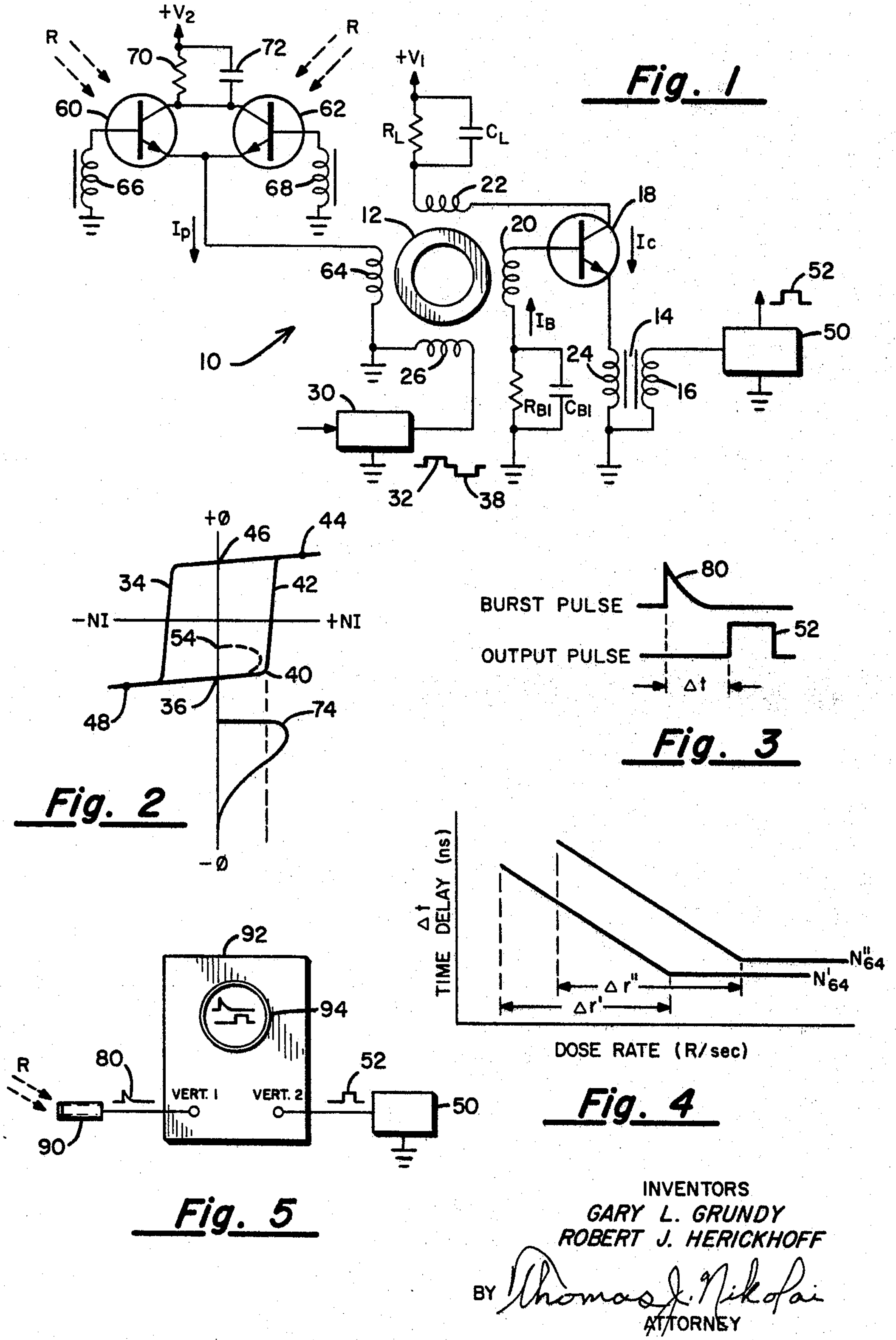
FIG. 1 is an illustration of a preferred embodiment of a dosimeter that may be utilized in the method of the present invention.
FIG. 2 is an illustration of the hysteresis loop characteristic of the saturable transformer of FIG. 1.
FIG. 3 is an illustration of the time delay relationship between the environmental nuclear radiation burst pulse and the output pulse of the dosimeter of FIG. 1.
FIG. 4 is an illustration of the graph of measured time delay versus radiation dose rate of the dosimeter of FIG. 1.
FIG. 5 is an illustration of an arrangement that may be utilized to measure the time delay between a radiation burst pulse and the output pulse produced by the dosimeter of FIG. 1.

With particular reference to FIG. 1 there is illustrated a preferred embodiment of the present invention. The basic circuitry of dosimeter 10 includes: saturable feedback transformer 12; nonsaturable output transformer 14 and its associated output winding 16; transistor 18 and its associated base electrode winding 20, collector-electrode winding 22 and emitter-electrode winding 24; and, clear-trigger winding 26. The operation of such basic circuitry as that of a blocking oscillator is well known and it will be described only briefly herein. First of all, it may be said that the circuit parameters of such basic circuitry are such that transistor 18 is biased into a normally nonconducting state by means of base resistor $R_{B1}$ and capacitor $C_{B1}$ to ground, emitter winding 24 to ground, load resistor $R_L$ and capacitor $C_L$ to reference potential $+V_1$. The biasing level of this biasing circuitry is such as to preclude the possibility of ionization currents turning on transistor 18 when dosimeter 10 is subjected to normally expected environmental radiation intensities. This basic circuitry provides a single output pulse at winding 16 of transformer 14 upon the coupling of the appropriate trigger pulse to winding 26 when the magnetization of saturable transformer 12 is switched into a second saturated triggered stable-state from an initially established first saturated clear stable-state that had been previously established by the coupling of an appropriate clear pulse 32 to winding 26 by pulse source 30.

Initially, assume that pulse source 30 is triggered causing it to couple a clear pulse 32 to winding 26 setting the magnetization of transformer 12 into an initial clear state. With particular reference to FIG. 2 there is illustrated a hysteresis loop 34 that defines the bistable characteristic of transformer 12 including the clear state 36 as a point of negative magnetic remanence. As a conventional means of triggering transistor 18 into conduction, pulse source 30 may be triggered causing it to couple a trigger pulse 38 to winding 26. The magnetomotive force coupling transformer 12, due to the flow of pulse 38 through winding 26, causes the magnetic state of transformer 12 to be driven into a $+NI$ direction along loop 34 past the switching threshold 40 and on into the high permeability area presented by the substantially vertical sloping portion 42 of loop 34. The change in flux in saturable transformer 12 due to the effect of the trigger pulse 38 flowing through winding 26 induces currents $I_B$ and $I_C$ in winding 20 and 22, respectively, that are associated with the base electrode and the collector electrode, respectively, of transistor 18, induce voltages in such windings that overcome the reverse biasing effect of the battery $+V_1$. These induced voltages in windings 20 and 22, in overcoming the reverse biasing effect of battery $+V_1$, initiate a regenerative feedback effect whereby transistor 18 is substantially instaneously driven into saturation. Upon the "bottoming," or saturation, of transistor 18 the regenerative effect of the voltages, and consequently currents, induced in windings 20 and 22 ceases whereupon the reverse biasing effect of battery $+V_1$ substantially instaneously drives transistor 18 back into its nonconducting state. After the turn-off of transistor 18 the magnetization of transformer 12 has been switched along portion 42 of loop 34 into point 44 which is a point of substantial magnetic saturation, and upon the turn-off of transistor 18 the magnetization of transformer 12 relaxes back into point 46 which is the triggered state of transformer 12 and is a state of positive magnetic remanence. To condition blocking oscillator 10 for the next pulse cycle it is merely necessary that pulse source 30 be triggered causing it to couple clear pulse 32 to winding 26 whereupon the magnetization of transformer 12 is driven into the $-NI$ direction along the hysteresis loop 34 from its triggered state 46 into substantially saturated point 48 and upon termination of pulse 32 the magnetization of transformer 12 is permitted to come to rest at its clear state 36.

The above described conventional pulse cycle of the blocking oscillator of transistor 18 couples an output pulse through its winding 24 to output transformer 14 which across its output winding 16 presents at utilization device 50 the high intensity, very narrow pulse 52 of substantially negligible rise and fall times. However, assume now that dosimeter 10 is subjected to a low- to intermediate-intensity pulsed radiation field R. Radiation field R, as previously described, generates radiation induced ions within the semiconductor material of the affected semiconductor elements. Accordingly, there is added to the basic circuitry previously described the circuitry associated with transistors 60 and 62 which transistors are normally biased into their nonconducting mode by the biasing circuit of their common coupled emitters through winding 64 to ground, of their respectively associated inductors 66 and 68 coupling the associated base electrodes to ground, and of their parallel arranged resistors 70 and capacitor 72 coupling the common-coupled collectors to reference potential $+V_2$.

Radiation field R, as previously described, generates radiation induced ions in transistors 60 and 62 that produce an ionizing current within the semiconductor material of such transistors that within a junction transistor, such as transistors 60 and 62 behaves as a base current drive signal producing a transient forward bias of the base-emitter junction. This transient forward bias, if of sufficient intensity to temporarily overcome the reverse biasing effect of battery $+V_2$, may, by the generation of ionizing current $I_P$ in winding 64, effect a partially switched time-limited (or amplitude-limited) stable-state 54 of transformer 12—see FIG. 2. Alternatively, pulsed radiation fields R of differing intensities would produce corresponding changes in the previously established clear state by the corresponding change in ionizing current $I_P$ whereby the magnetization of transformer 12 could be set at any partially switched remanent magnetic stable-state along the vertical axis $\phi$ between the limits of state 36 and state 46, each of which differing partially switched remanent magnetic stable state of saturable transformer 12 would induce a corresponding change of flux therein that would be coupled to the associated windings such as windings 20 and 22. Accordingly, the nature of output pulse 52 that would be emitted from utilization device 50 would be a function of the pulsed radiation field effect on the circuitry associated with transistors 60 and 62. As is well known, differing effects of ionizing current $I_P$ upon transformer 12 may be produced by varying the number of turns of winding 64 whereby the degree of the magnetomotive force about transformer 12 in moving from its clear state 36—see FIG. 2—is a function of its effective ampere-turns $N_{64}I_P$.

With particular reference to FIG. 3 there is presented an illustration of the time delay relationship between the nuclear radiation burst pulse 80 and the output pulse 52 where, as stated before, the delay $\Delta t$ in nanoseconds (ns.) between pulse 80 and pulse 52 is a function of the dose rate of the nuclear radiation burst 80 in roentgens per second (r./sec.). By subjecting dosimeter 10 of FIG. 1 to a plurality of pulse 80 dose rates, or intensities, and ploting a graph of the observed delay $\Delta t$ versus the associated pulse 80 dose rate there is produced a plot of the functional relationship therebetween.

With particular reference to FIG. 4 there are presented curves defining such relationship. Radiation burst 80, as described above, initiates the flow of ionizing current $I_P$ in transistors 60, 62 of FIG. 1 which generates a magnetomotive force $H_P$—see curve 74, FIG. 2—that is coupled to core 12 via the flow of ionizing current $I_P$ through winding 64, i.e., $H_P=N_{64}I_P$, where $N_{64}$ is the number of turns of winding 64 about core 12. The observed delay between the initiation of pulse 80 and that of pulse 52 from utilization device 50 is plotted for values of $N'_{64}$, and $N''_{64}$ providing a corresponding curve for each value. As the curves $N'_{64}$ and $N''_{64}$ are substantially linear over a substantially constant length $\Delta r$, i.e., $\Delta r' \cong \Delta r''$ each value of $N_{64}$ provides a range of does rates, i.e., $\Delta r$, over which there is provided a linear relationship between the dose rate of the particular radiation burst 80 and the observed delay between the initiation of the radiation burst 80 and the initiation of the output pulse 52. By utilizing a plurality of dosimeters 10, each similar except for having a different value of $N_{64}$, a wide range of unknown dose rates may be measured.

The method of measuring the time delay $\Delta t$ between the radiation burst R and the output pulse 52 from dosimeter 10 may be any of many well-known arrangements. With particular reference to FIG. 5 there is presented the arrangement utilized by the applicants. A sensor 90 when affected by the radiation burst 9 couples a pulse 80 to the Vertical 1 input of a dual channel oscilloscope 92. Subsequently, utilization device 50 couples output pulse 52 to the Vertical 2 input of oscilloscope 92 which produces, on its face 94, a time-delay picture of pulses 80, 52 as in FIG. 3.

In order to facilitate an understanding of the operation of the present invention, the following groups of actual values of the parameters of the illustrated embodiment of FIG. 1 are presented. It should be understood that the principles of operation of such circuit may be present in circuits having a wide range of individual specifications so that the list of values here presented should not be construed as a limitation.

(1) Saturable transformer 12:
  (a) Core—5 maxwell, tape wound.
  (b) Windings—
    (1) 20 ---------- turns -- 10
    (2) 22 ---------- do ---- 3
    (3) 26 ---------- do ---- 3
    (4) 64 ---------- do ---- 3

(2) Output transformer 14:
  (a) Core—Ferrox-Cube 3E2A.
  (b) Windings—
    (1) 16 ---------- turns -- 5
    (2) 24 ---------- do ---- 5

(3) Transistors:
  (a) 60, 62=2N1309 Texas Instruments.
  (b) 18=2N3444 Motorola.

(4) Resistors:
  (a) 70 ---------- kilohms (K) -- 5
  (b) $R_{B1}$ ---------- ohms -- 10
  (c) $R_L$ ---------- do ---- 10

(5) Capacitors:
  (a) 72 ---------- microfarad (μf.) -- 0.1
  (b) $C_{B1}$ ---------- picofarads (pf.) -- 100
  (c) $C_L$ ---------- do ---- 200

(6) Reference potentials:
  (a) $+V_1$ ---------- volts (v.) -- +20
  (b) $+V_2$ ---------- do ---- +9

It is apparent, therefore, that the applicants have in their illustrated embodiment disclosed a dosimeter that is capable of measuring the intensity of a nuclear radiation burst over a wide range of dose rates. It is understood that suitable modifications may be made in the structure as disclosed provided that such modifications come within the spirit and scope of the appended claims. Having now fully illustrate and describe our invention, what we claim to be new and desire to protect by Letters Patent is set forth in the appended claims.

What is claimed is:

1. The method of determining the intensity of a nuclear-radiation burst as a function of the time delay between the radiation burst and a blocking-oscillator output signal, comprising the steps of:
(a) subjecting a semiconductor element to a nuclear-radiation burst of known intensity inducing ionization currents therein;
(b) coupling said ionization currents to a blocking oscillator causing said blocking-oscillator to emit an output signal;
(c) measuring the time delay between the radiation burst and the output signal;
(d) repeating steps (a), (b), and (c) for a series of nuclear-radiation bursts of different known intensities; and,
(e) plotting a curve of time delay versus radiation burst intensity.

2. The method of claim 1 further including the steps of:
(a) subjecting said semiconductor element to a nuclear-radiation burst of unknown intensity;
(b) measuring the time delay between said nuclear-radiation burst and the associated output signal;
(c) determining the intensity of said nuclear-radiation burst from the curve of claim 1, step (e), for the measured time delay of step (b).

3. The method of determining the intensity of a nuclear-radiation burst as a function of the time delay between the initiation of the radiation burst and the initiation of a blocking oscillator output signal, comprising the steps of:
(a) subjecting a semiconductor element to a nuclear-radiation burst inducing ionization currents therein;
(b) coupling said ionization currents to the feedback transformer of a blocking oscillator causing said blocking oscillator to emit an output pulse therefrom;
(c) measuring the time delay between the initiation of the radiation burst and of the output signal; and,
(d) comparing the measured time delay to a predetermined range of time delays to determine the corresponding radiation burst intensity.

4. The method of determining the intensity of a nuclear-radiation burst pulse, comprising the steps of:
(a) subjecting a semiconductor element to a nuclear-radiation burst pulse of known intensity for inducing known ionization currents therein;
(b) coupling said known ionization currents to a pulse generator for producing an output pulse;
(c) measuring the time delay between the burst pulse and the output pulse;
(d) repeating steps (a), (b), and (c) for a series of burst pulses of different known intensities; and, (e) plotting a curve of the measured time delay versus each corresponding known intensity;
(f) subjecting said semiconductor element to a nuclear-radiation burst pulse of unknown intensity inducing unknown ionization currents therein;
(g) coupling said unknown ionization currents to said pulse generator for producing an output pulse;
(h) measuring the time delay between the unknown intensity burst pulse and its generated output pulse;
(i) determining the intensity of the unknown intensity burst pulse from the curve of step (e) for the measured time delay of step (h).

References Cited

UNITED STATES PATENTS

| | | | |
|---|---|---|---|
| 3,147,380 | 9/1964 | Buckingham et al. | |
| 3,253,153 | 5/1966 | Stoddard | 331—66 X |
| 3,287,975 | 11/1966 | Mason et al. | 331—66 X |

RALPH G. WILSON, Primary Examiner

A. B. CROFT, Assistant Examiner

U.S. Cl. X.R.

250—83.1; 331—66, 112